(12) United States Patent
Shields

(10) Patent No.: US 6,180,534 B1
(45) Date of Patent: *Jan. 30, 2001

(54) BORDERLESS VIAS WITHOUT DEGRADATION OF HSQ GAP FILL LAYERS

(75) Inventor: Jeffrey A. Shields, Sunnyvale, CA (US)

(73) Assignee: Advanced Micro Devices, Inc., Sunnyvale, CA (US)

( * ) Notice: Under 35 U.S.C. 154(b), the term of this patent shall be extended for 0 days.

This patent is subject to a terminal disclaimer.

(21) Appl. No.: 09/074,422

(22) Filed: May 8, 1998

Related U.S. Application Data

(63) Continuation-in-part of application No. 08/993,125, filed on Dec. 18, 1997, now Pat. No. 5,958,798.

(51) Int. Cl.⁷ .................................................. H01L 21/302
(52) U.S. Cl. .......................... 438/725; 438/780; 438/624
(58) Field of Search ................................... 438/597, 623, 438/624, 725, 780

(56) References Cited

U.S. PATENT DOCUMENTS

| | | | |
|---|---|---|---|
| 4,201,579 | * 5/1980 | Robinson et al. | 430/323 |
| 5,691,117 | * 11/1997 | Lutsic et al. | 430/329 |
| 5,855,962 | * 1/1999 | Cote et al. | 427/376.2 |
| 5,958,798 | * 9/1999 | Shields | 438/710 |
| 5,970,376 | * 10/1999 | Chen | 438/637 |
| 6,013,581 | * 1/2000 | Wu et al. | 438/734 |
| 6,030,901 | * 2/2000 | Hopper et al. | 438/711 |
| 6,060,384 | * 1/2000 | Chen et al. | 438/623 |

* cited by examiner

*Primary Examiner*—Caridad Everhart

(57) ABSTRACT

Spin-on HSQ is employed to gap fill patterned metal layers in manufacturing ultra high density, multi-metal layer semiconductor devices. The degradation of deposited HSQ layers during formation of borderless vias, as from photoresist stripping using an $O_2$-containing plasma, is significantly reduced or prevented by including hydrogen in the stripping plasma. Embodiments include stripping in a plasma containing a sufficient amount of a forming gas ($H_2/N_2$) to prevent reduction of the number of Si—H bonds of the deposited HSQ gap fill layer below about 70%, before and after solvent cleaning.

16 Claims, 3 Drawing Sheets

BORDERLESS VIAS WITHOUT DEGRADATION OF HSQ GAP FILL LAYERS

RELATED APPLICATIONS

This application is a continuation-in-part application of application Ser. No. 08/993,125, filed Dec. 18, 1997, now U.S. Pat. No. 5,958,798 the entire disclosure of which is hereby incorporated herein by reference.

TECHNICAL FIELD

The present invention relates to high density, multi-metal layer semiconductor device with reliable interconnection patterns. The invention has particular applicability in manufacturing ultra large scale integration multi-metal layer semiconductor devices with design features of 0.25 microns and under.

BACKGROUND ART

The escalating demands for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically doped monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown). After photolithography, etching is then conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300° C. to about 350° C., and then cured in a verticle furnace at about 350° C. to about 400° C. for a period of time up to about one hour, depending upon the particular SOG material employed, to effect planarization. Another oxide is deposited by plasma enhanced chemical vapor deposition (PECVD) and then planarization is then performed, as by CMP.

A through-hole is then formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature. Such a conventional technique is illustrated in FIG. 3, wherein metal feature 30 of a first patterned metal layer is formed on first dielectric layer 31 and exposed by through-hole 32 formed in second dielectric layer 33. In accordance with conventional practices, through-hole 32 is formed so that metal feature 30 encloses the entire bottom opening, thereby serving as a landing pad for metal plug 34 which fills through-hole 32 to form conductive via 35. Thus, the entire bottom surface of conductive via 35 is in direct contact with metal feature 30. Conductive via 35 electrically connects metal feature 30 and metal feature 36 which is part of a second patterned metal layer. As shown in FIGS. 2 and 3, the side edges of a metal feature or conductive line, e.g., 30A, 30B, and 36A, and 36B, taper somewhat as a result of etching.

The reduction of design features to the range of 0.25 microns and under requires extremely high densification. The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, i.e., height/width of the through-hole opening. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a misaligned through-hole, due to the low density and poor stability of SOG. As a result of such penetration, moisture and gas accumulate thereby increasing the resistance of the interconnection. Moreover, spiking can occur, i.e., penetration of the metal plug to the substrate causing a short. Adverting to FIG. 4, first dielectric layer 41 is formed on substrate 40 and a first metal pattern comprising a first metal feature, e.g., metal line 45, comprising anti-reflective coating 45A, is formed on first dielectric layer 41 gap filled with SOG 42. Dielectric layer 43 is then deposited and a misaligned through-hole formed therein exposing a portion of the upper surface and at least a portion of a side surface of metal line 45, and penetrating into and exposing a portion of SOG layer 42. Upon filling the through-hole with a metallic plug 44, typically comprising an initial barrier layer (not shown) and tungsten, spiking occurs, i.e., penetration through to substrate 40, thereby causing shorting.

Hydrogen silsesquioxane (HSQ) offers many advantages for use in interconnect patterns. HSQ is relatively carbon free, thereby avoiding poison via problems. Moreover, due to the virtual absence of carbon, it is not necessary to etch back HSQ below the upper surface of the metal lines to avoid shorting. In addition, HSQ exhibits excellent planarity and is capable of gap filling interwiring spacings less than 0.30 microns employing conventional spin-on equipment. HSQ undergoes a melting phase at approximately 200° C., but does not convert to the high dielectric constant glass phase until reaching temperatures of about 400° C. for intermetal applications and about 700° C. to about 800° C. for premetal applications.

However, HSQ is susceptible to degradation during processing leading to various problems, such as voids when forming borderless vias. For example, when forming a borderless via, a photoresist mask is deposited and the misaligned through-hole etched to expose a portion of an upper surface and a portion of a side surface of a metal line, and penetrate into and expose the HSQ layer. The photoresist mask is then stripped, typically employing an oxygen ($O_2$)-containing plasma. Subsequently, solvent cleaning is performed and a second plasma stripping is conducted, also typically employing an $O_2$-containing plasma. It was found that the $O_2$-containing plasma employed to strip the photoresist mask, as well as the second plasma stripping subsequent to solvent cleaning, degraded the HSQ layer. Upon subsequent filling of the misaligned through-hole, as with a barrier material, such as titanium nitride or titanium-titanium nitride, spiking occurred, i.e., the barrier material penetrated through the HSQ layer to the substrate or underlying conductive feature.

HSQ typically contains between about 70% and about 90% Si—H bonds. However, upon exposure to an $O_2$-containing plasma, a considerable number of Si—H bonds are broken and Si—OH bonds are formed. Upon treatment with an $O_2$-containing plasma, as much as about 20% to about 30% of the Si—H bonds in the deposited HSQ film remained. In addition, it was found that exposure to an $O_2$-containing plasma increased the moisture content of the as deposited HSQ film and its propensity to absorb moisture. An HSQ film having reduced Si—H bonds and high Si—OH bonds tends to absorb moisture from the ambient, which moisture outgasses during subsequent barrier metal deposition. Thus, it was found that during subsequent barrier and metal deposition, e.g., titanium-titanium nitride and tungsten, outgassing occurred thereby creating voids leading to incomplete electrical connection. In copending application Ser. No. 08/992,430, filed on Dec. 18, 1997, a method is disclosed for selectively heating portions of a deposited HSQ layer adjoining a metal feature to increase the resistance of such adjoining portions to penetration when etching a misaligned through-hole for a borderless via.

In view of the manifest advantages of HSQ, there exists a need to provide efficient methodology enabling the use of HSQ for filling gaps in patterned conductive layers. There also exists a need for efficient methodology enabling the use of HSQ for gap filling patterned conductive layers containing features interconnected through borderless vias.

DISCLOSURE OF THE INVENTION

An object of the present invention is a method of manufacturing a high density multi-metal layer semiconductor device with design features of 0.25 microns and under, and an interconnection pattern comprising high integrity borderless vias.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: forming a first dielectric layer on a substrate; forming a first patterned conductive layer having gaps on the first dielectric layer, the first patterned conductive layer comprising a first conductive feature having an upper surface and side surfaces; depositing a dielectric layer comprising hydrogen silsesquioxane (HSQ) containing Si—H bonds to fill the gaps; depositing a second dielectric layer on the first patterned conductive layer and on the HSQ gap fill layer; forming a photoresist mask on the second dielectric layer; forming a through-hole in the second dielectric layer exposing a portion of the upper surface and at least a portion of a side surface of the first conductive feature, and penetrating into and exposing a portion of the HSQ gap fill layer; and removing the photoresist mask employing a plasma containing hydrogen.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
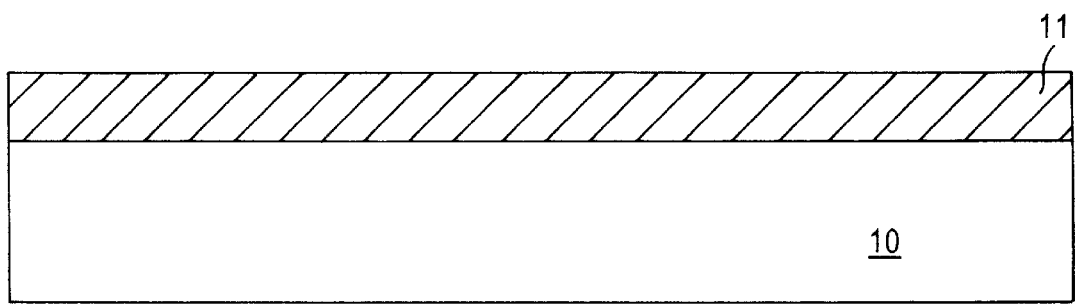
FIGS. 1 AND 2 schematically illustrate a conventional gap filling technique.
Figure 2:
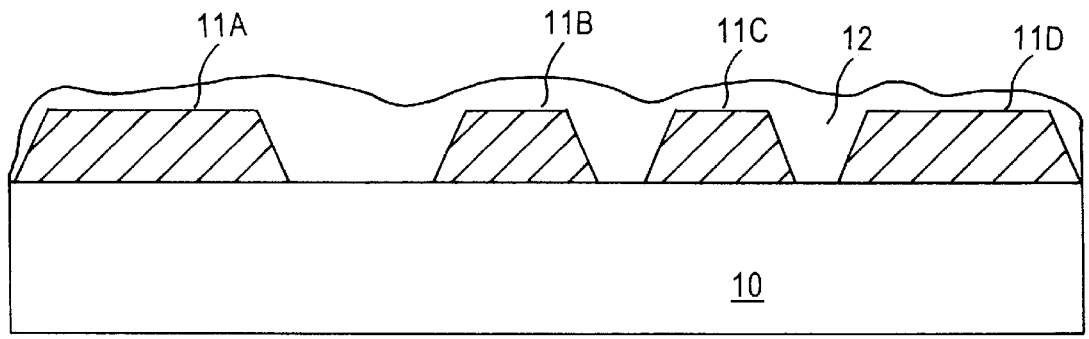
Figure 3:
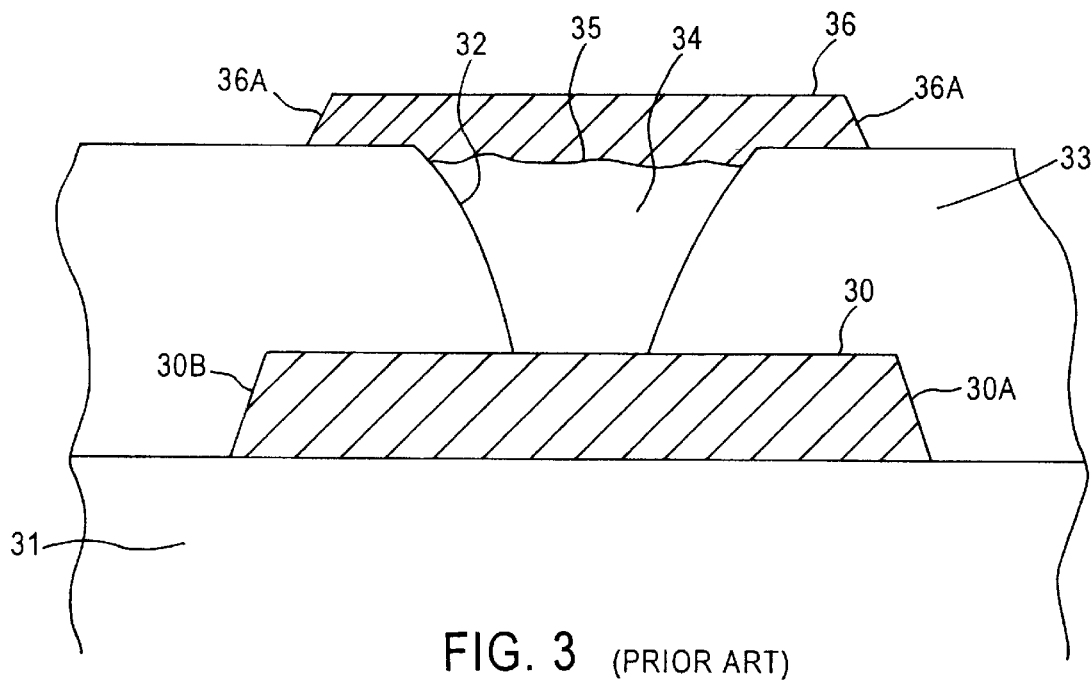
FIG. 3 schematically illustrates a conventional metal plug via interconnection.
Figure 4:
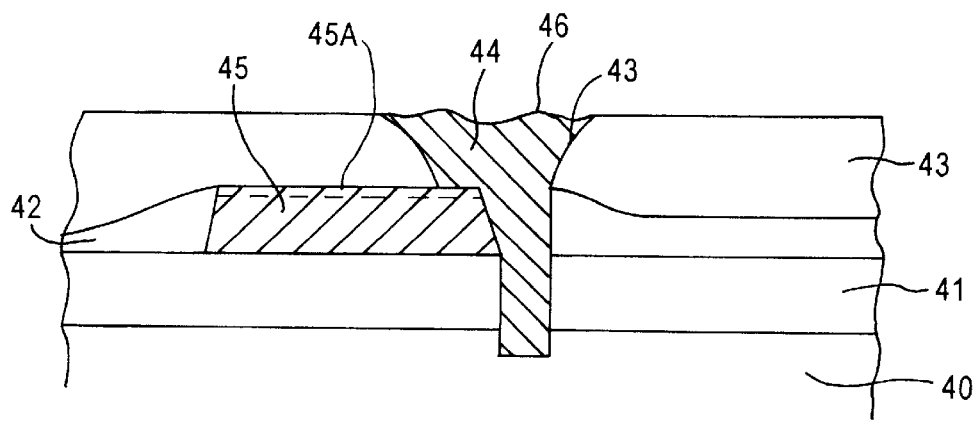
FIG. 4 schematically illustrates spiking in a borderless via.

The present invention enables the effective use of HSQ to fill gaps in patterned conductive layers, e.g., polycrystalline or metal layers, with little or no degradation of the as-deposited HSQ gap fill layer, as during subsequent processing. For example, as-deposited HSQ undergoes degradation upon subsequent processing in removing the photoresist mask employed for through-hole formation and cleaning. Conventional practices comprise stripping the photoresist mask using an $O_2$-containing plasma. Solvent cleaning is then performed followed by another plasma stripping step, typically employing an $O_2$-containing plasma. The through-hole is then filled with a composite conductive plug comprising an initial barrier material, such as titanium-titanium nitride or titanium nitride, followed by tungsten.

HSQ is a highly desirable dielectric material for gap filling, in that it exhibits excellent planarity and gap filling capacity employing conventional spin-on equipment. HSQ can easily fill gaps, e.g., interwiring spacings, less than about 0.30 microns. Moreover, due to the use of a carbon-free polymer precursor, poison via problems are not encountered, and HSQ need not be etched back below the upper surface of the metal line. One form of HSQ is commercially available from Dow Corning Corp. under the product name Flowable Oxide™ or $FO_x$™.

HSQ contains primarily Si—H bonds, e.g., between about 70% to about 90% Si—H bonds. However, HSQ is vulnerable to degradation during processing, whereby the number of Si—H bonds is significantly decreased. For example, exposure to an O$_2$-containing plasma, as during conventional photoresist stripping before solvent cleaning, and plasma stripping after solvent cleaning, can cause a reduction in the number of Si—H bonds of HSQ by about 20% to about 30%, with an increase in the number of Si—OH bonds. As a result, such degraded HSQ exhibits a propensity to pick up moisture from the ambient, or from any wet treatments. During subsequent filling of a through-hole to form a borderless via, as when sputter depositing a titanium-titanium nitride barrier layer in a conventional HI-VAC sputter chamber, such absorbed moisture is outgassed, thereby creating voids and reducing device reliability. Outgassing also occurs when depositing titanium nitride by chemical vapor deposition as, for example, by the method disclosed in copending application Ser. No. 08/924,131, filed on Sep. 5, 1997.

In accordance with the present invention, the degradation of as deposited HSQ, as during subsequent exposure to an O$_2$-containing plasma, is avoided or substantially reduced by introducing hydrogen into the stripping plasma. It was found that the presence of hydrogen in the stripping plasma minimizes the reduction in the number of Si—H bonds, thereby reducing the number of Si—OH bonds formed. Embodiments of the present invention comprise introducing a sufficient amount of hydrogen in the stripping plasma to prevent reduction in the number of Si—H bonds of the as-deposited HSQ gap fill layer below about 70%, preferably preventing reduction in the number of Si—H bonds of the as-deposited HSQ gap fill layer below about 80%, e.g., below about 87%. Embodiments of the present invention include introducing hydrogen in the stripping plasma step conventionally performed both prior and subsequent to solvent cleaning. In each such plasma stripping step, hydrogen is preferably included in the stripping plasma in an amount to prevent reduction in the number of Si—H bonds of the as-deposited HSQ gap fill layer below about 70%, preferably preventing the number of Si—H bonds to be reduced below about 80%, e.g., below about 87%.

Ideally, oxygen is excluded during plasma stripping. However, it may be advantageous to include oxygen in an amount to efficiently conduct plasma stripping, particularly when removing the photoresist mask. Since the as-deposited HSQ gap fill layer suffers no or little reduction in the number of Si—H bonds, it does not exhibit a significant propensity to absorb moisture from the ambient.

In accordance with the present invention, hydrogen is introduced into the plasma employed for stripping before and after solvent cleaning when removing the photoresist mask employed to form the misaligned through-hole. The amount of hydrogen introduced can be optimized in a particular situation and is typically an amount sufficient to prevent undesirable reduction in the Si—H bond below about 70%, preferably not below about 80%, e.g., not below about 87%. This can be accomplished by introducing a forming gas comprising various ratios, e.g., about 1 to about 20% by volume of hydrogen in nitrogen, into the plasma. A suitable amount of forming gas can be determined in a particular situation consistent with the objectives of the present invention, i.e., minimizing subsequent reduction in the number of Si—H bonds of the as-deposited HSQ gap fill layer. It was found that the introduction of a forming gas, comprising 96% nitrogen and 4% hydrogen, in the amount of about 2% to about 20% by volume, e.g., about 10% by volume, effectively prevents reduction in the number of Si—H bonds of the as-deposited gap filled layer below about 70%. The resulting HSQ gap fill layer does not exhibit any propensity to absorb a significant amount of moisture from the ambient. Accordingly, outgassing and voids do not occur upon subsequent filling the through-hole with conductive material.

A method of forming a borderless via in accordance with an embodiment of the present invention comprises forming a first dielectric layer on a semiconductor substrate and patterning a first metal layer on the first dielectric layer to form metal features separated by gaps, such as metal lines separated by interwiring spacings. The gaps are then filled by depositing HSQ, as by employing conventional spinning equipment employed for SOG, at an appropriate temperature, e.g., about 200° C. HSQ is easily capable of completely voidlessly filling gaps even under 0.30 microns. A second dielectric layer is then deposited on the first patterned metal layer and HSQ layer. A misaligned through-hole is then formed in the second dielectric layer and partially penetrating into the HSQ layer exposing a portion of the upper surface and at least a portion of a side surface of the first metal layer and a portion of the HSQ layer.

The through-hole is formed by depositing a photoresist mask on the second dielectric layer and etching through the photoresist mask and a portion of the HSQ layer, typically by anisotropic etching. Conventional methodology comprises removing the photoresist mask employing an O$_2$-containing plasma, solvent cleaning and resist stripping in an O$_2$-containing plasma. The use of an O$_2$-containing plasma degrades the deposited HSQ gap fill layer by reducing the number of Si—H bonds and increasing the number of Si—OH bonds, rendering it prone to absorb moisture from the ambient. Such adverse consequences are avoided in accordance with the present invention by conducting the photoresist plasma stripping in a plasma containing a sufficient amount of hydrogen to prevent reduction in the amount of Si—H bonds of the as-deposited HSQ gap fill layer to below about 70%, preferably not below about 80%, e.g., not below about 87%. Hydrogen is incorporated in the initial photoresist plasma stripping step prior to solvent cleaning as well the plasma stripping step conducted subsequent to solvent cleaning. Hydrogen can be incorporated by introducing about 2% to about 100% by volume of a forming gas comprising various ratios, e.g., up to about 20% by volume of hydrogen in nitrogen, e.g., about 10% by volume of the forming gas.

After stripping the photoresist mask with a plasma, e.g., an O$_2$-containing plasma containing hydrogen in accordance with the present invention, solvent cleaning and further plasma stripping in a hydrogen-containing plasma in accordance with the present invention, the misaligned through-hole is filled with a conductive material, e.g., a composite plug. Initially, a barrier layer of titanium, titanium-nitride, titanium-tungsten or titanium-titanium nitride is deposited which serves as an adhesion promoter for subsequently deposited tungsten which constitutes the primary plug material. The barrier material, e.g., titanium-titanium nitride, can be sputter deposited employing conventional sputtering equipment.

In another embodiment of the present invention, a CVD-TiN barrier layer is deposited in accordance with the methodology disclosed in copending application Ser. No. 08/924, 131, filed Sep. 5, 1997. An advantage of this embodiment is that the H$_2$/N$_2$ plasma treatment of the HSQ film and the H$_2$/N$_2$ plasma treatment of the deposited CVD-TiN film can be conducted in the same chamber.

Figure 5:
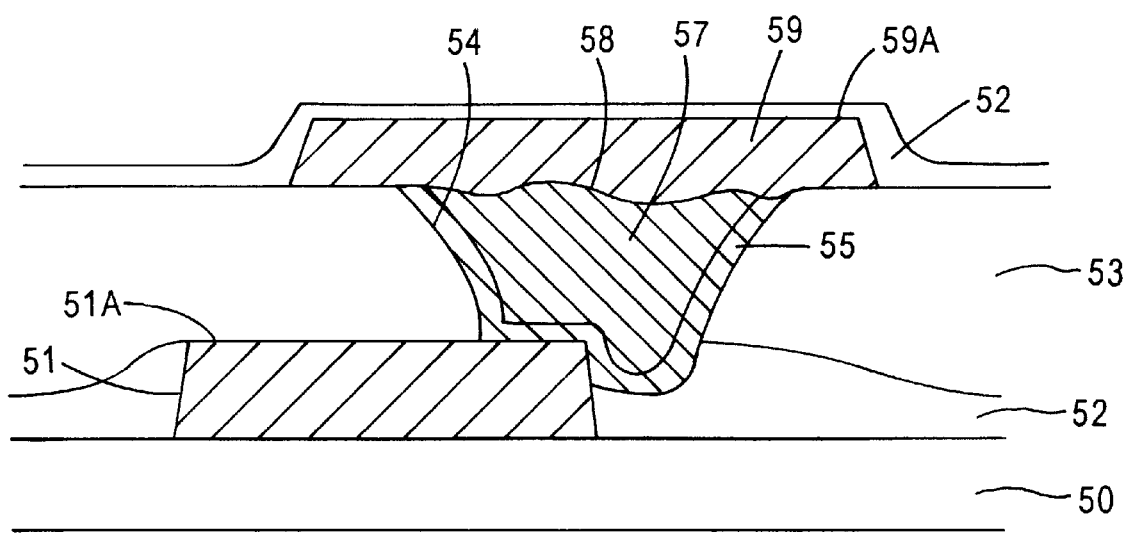
FIG. 5 schematically illustrates a borderless via formed according to the present invention.

An embodiment of the present invention is schematically illustrated in FIG. 5, wherein metal feature 51 of a patterned metal layer is formed on dielectric layer 50, with anti-reflective coating 51A thereon. Gaps between metal features are filled with HSQ 52. An oxide 53, typically an oxide derived from TEOS (tetraethyl orthosilicate) or silane by plasma enhanced chemical vapor deposition (PECVD), is then deposited and then planarized, as by CMP. A photoresist mask (not shown) is formed thereon. Etching is then conducted to form misaligned through-hole 54 penetrating HSQ layer 52 and exposing a portion of a side surface of metal feature 51. After formation of through-hole 54, the photoresist mask employed is stripped employing an $O_2$-containing plasma which also contains a sufficient amount of hydrogen to prevent reduction in the number of Si—H bonds of the as-deposited HSQ gap fill layer 52 below about 70%, preferably not below about 80%, e.g., not below about 87%. Solvent cleaning is then conducted and plasma stripping again performed. However, in accordance with the present invention, plasma stripping performed subsequent to solvent cleaning is also conducted in a plasma containing a sufficient amount of hydrogen to prevent reduction in the number of Si—H bonds of the as-deposited HSQ gap fill layer below about 70%, preferably not below about 80%, e.g., not below about 87%. Degradation of the as-deposited HSQ layer which typically occurs upon $O_2$-plasma stripping of a photoresist layer and plasma stripping after subsequent solvent cleaning is avoided or substantially prevented by the inclusion of hydrogen in the stripping plasma. Accordingly, the formation of a significant number of Si—OH bonds along with an undesirable propensity to absorb moisture are prevented. As a result, the present invention advantageously prevents the generation of voids by outgassing upon filling the through-hole with conductive material, yielding a highly reliable interconnect pattern.

Through-hole 54 is then filled with a composite plug, as by initially depositing a barrier layer 55 which serves as an adhesion promoter for tungsten 57. The barrier layer is typically a refractory metal, such as titanium, titanium-nitride, titanium-tungsten or titanium-titanium nitride.

After forming conductive via 58, a second patterned metal layer is formed on second dielectric layer 53 and comprises metal feature 59, with anti-reflective coating 59A thereon, electrically connected to metal feature 51 through conductive via 58. The methodology is then repeated by gap filling the second patterned metal layer employing HSQ and substantially repeating the plasma stripping steps in forming misaligned through-holes for borderless vias by incorporating a sufficient amount of hydrogen during plasma stripping to avoid undesirable reduction in the number of Si—H bonds of the as-deposited HSQ gap fill layers until a desired number of patterned metal layers are formed and gap filled, e.g., five metal layers.

The metal layers employed in the present invention are consistent with the conventional practices and typically comprise aluminum or an aluminum alloy. Embodiments of the present invention include forming a composite patterned metal layer comprising an initial refractory metal layer, such as tungsten, titanium or titanium nitride, an intermediate aluminum or aluminum alloy layer, and an upper anti-reflective coating, such as titanium-titanium nitride. In accordance with the present invention, tungsten is deposited by conventional CVD technology.

The present invention is applicable to the production of various types of semiconductive devices, particularly high density multi-metal patterned layers with submicron features, particularly submicron features of 0.50 microns and below, exhibiting high speed characteristics and improved reliability. The present invention enables the advantageous use of HSQ to gap fill patterned metal layers without the adverse consequences of process induced degradation, as from exposure to an $O_2$-containing plasma. Thus, the present invention solves the problem of void formation in HSQ during borderless via formation. The present invention is cost effective and can easily be integrated into conventional processing and equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting point metal such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:
   forming a first dielectric layer on a substrate;
   forming a first patterned conductive layer having gaps on the first dielectric layer, the first patterned conductive layer comprising a first conductive feature having an upper surface and side surfaces;
   depositing a dielectric layer comprising hydrogen silsesquioxane (HSQ) containing Si—H bonds directly on the first patterned conductive layer and on the first dielectric layer to fill the gaps;
   depositing a second dielectric layer on the first patterned conductive layer and on the HSQ gap fill layer;
   forming a photoresist mask on the second dielectric layer;
   forming a through-hole in the second dielectric layer exposing a portion of the upper surface and at least a portion of a side surface of the first conductive feature, and penetrating into and exposing a portion of the HSQ gap fill layer; and removing the photoresist mask utilizing a plasma containing a sufficient amount of hydrogen to prevent reduction in the number of Si—H bonds in the as-deposited HSQ gap fill layer below about 70%.

2. The method according to claim 1, comprising removing the photoresist mask in a plasma containing oxygen.

3. The method according to claim 2, comprising removing the photoresist mask in a plasma containing a forming gas comprising of hydrogen in nitrogen.

4. The method according to claim 3, wherein the plasma comprises up to 100% by volume of the forming gas.

5. The method according to claim 1, wherein the conductive layer is a metal layer comprising metal features separated by gaps.

6. The method according to claim 5, comprising filling the through-hole with a composite conductive plug.

7. The method according to claim 6, comprising depositing a first conductive barrier layer which acts as an adhesion promoter for a second conductive layer.

8. The method according to claim 7, wherein the first conductive layer comprises titanium, titanium-nitride, titanium-tungsten or titanium-titanium nitride, and the second conductive layer comprises tungsten.

9. The method according to claim 5, wherein the first metal layer is a composite comprising:
   a lower refractory metal layer;
   an intermediate layer comprising aluminum or an aluminum alloy; and
   an upper anti-reflective coating.

10. The method according to claim 5, comprising forming a second patterned metal layer on the second dielectric layer, wherein the second patterned metal layer comprises a second metal feature electrically connected to the first metal feature through the borderless via.

11. The method according to claim 5, wherein the first metal feature comprises a metal line and the gaps comprise interwiring spacings.

12. The method according to claim 11, wherein the first patterned metal layer comprises a plurality of metal features having a maximum dimension of about 0.50 microns and interwiring spacings having a maximum dimension of about 0.375 microns.

13. The method according to claim 1, further comprising:
    solvent cleaning; and
    plasma stripping after solvent cleaning using a plasma containing hydrogen.

14. The method according to claim 13, wherein the plasma employed for stripping after solvent cleaning contains a sufficient amount of hydrogen to prevent reduction in the number of Si—H bonds in the as-deposited HSQ gap fill layer below about 70%.

15. The method according to claim 14, wherein the plasma employed for stripping subsequent to solvent cleaning contains oxygen.

16. The method according to claim 15, wherein the plasma employed for stripping subsequent to solvent cleaning contains about 2 to about 100 vol. % of a forming gas containing nitrogen and hydrogen.

* * * * *